(12) United States Patent  (10) Patent No.: US 7,636,012 B2
Iida  (45) Date of Patent: Dec. 22, 2009

(54) CHARGE DOMAIN FILTER DEVICE

(75) Inventor: Sachio Iida, Chiba (JP)

(73) Assignee: Sony Corporation, Tokyo (JP)

( * ) Notice: Subject to any disclaimer, the term of this patent is extended or adjusted under 35 U.S.C. 154(b) by 91 days.

(21) Appl. No.: 11/754,763

(22) Filed: May 29, 2007

(65) Prior Publication Data

US 2008/0088389 A1  Apr. 17, 2008

(30) Foreign Application Priority Data

May 30, 2006  (JP)  ............................. 2006-149367

(51) Int. Cl.
*H03B 1/00* (2006.01)
(52) U.S. Cl. .................................... 327/554
(58) Field of Classification Search ......... 327/552–555, 327/557, 558
See application file for complete search history.

(56) References Cited

U.S. PATENT DOCUMENTS 5,751,188 A *  5/1998  Guegnaud et al. ........... 329/323
5,841,876 A *  11/1998  Gifford et al. ............ 381/71.14
6,168,707 B1 *  1/2001  Somes et al. ................ 205/775
6,590,943 B1 *  7/2003  Ali ............................. 375/332
6,693,970 B2 *  2/2004  Vankka ........................ 375/261

FOREIGN PATENT DOCUMENTS

JP  2003-020554  1/2003

OTHER PUBLICATIONS

Richard Carley et al., "High-Speed Low-Power Integrating CMOS Sample-and-Hold Amplifier Architecture", Dept. of electrical and Computer Engineering. Carnegie Mellon University. IEEE 1995 Custom Integrated Circuits Conference.
Jiren Yuan, "A Charge Sampling Mixer with Embedded Filter Function for Wireless Applications", Competence Center for Circuit Design, Department of Applied Electronics, Lund University, 2000.

* cited by examiner

*Primary Examiner*—Jeffrey S Zweizig
(74) *Attorney, Agent, or Firm*—Finnegan, Henderson, Farabow, Garrett & Dunner, L.L.P.

(57) ABSTRACT

A charge domain filter device includes a SINC filter with a frequency characteristic expressed by a SINC function, and a bandpass filter connected to an output end of the SINC filter and having a frequency characteristic with a particular center frequency.

8 Claims, 12 Drawing Sheets

(PRIOR ART)

(PRIOR ART)

CHARGE DOMAIN FILTER DEVICE

CROSS REFERENCES TO RELATED APPLICATIONS

The present invention contains subject matter related to Japanese Patent Application JP 2006-149367 filed in the Japanese Patent Office on May 30, 2006, the entire contents of which are incorporated herein by reference.

BACKGROUND OF THE INVENTION

1. Field of the Invention

The present invention relates to a filter device designed by charge domain operations (hereinafter, called a charge domain filter device).

2. Description of the Related Art

In a wireless communication SoC (System On Chip) in which a RF (Radio Frequency) circuit and a digital circuit are integrated on a single chip using a CMOS (Complementary Metal Oxide Semiconductor) technique, it is known to accomplish filtering or decimation using current mode sampling at a high clock rate or an analog discrete-time signal processing technique such as a switched capacitor circuit whereby a small-sized low-power RF circuit is realized (see, for example, L. Richard Carley and Tamal Mukherjee, "High-Speed Low-Power Integrating CMOS Sample-and-Hold Amplifier Architecture," Proceedings of IEE 1995, Custom Integrated Circuits Conference, pp 543-546, May 1995).

For example, it is known to realize a SINC filter circuit having a frequency characteristic given by a SINC function by using a charge domain filter circuit configured using a transconductor and switches without using an operational amplifier (see, for example, J. Yuan, "A Charge Sampling Mixer with Embedded Filter Function for Wireless Applications", Proceedings of IEEE 2000 International Conference on Microwave and Millimeter Wave Technology, pp. 315-318, September, 2000). An example of a charge domain filter circuit functioning as a SINC filter circuit according to a conventional technique is described below with reference to FIG. 10. In the example shown in FIG. 10, the charge domain filter circuit 10 functioning as a SINC filter circuit includes a transconductor 12, a first switch 14, a second switch 16, a third switch 18, and capacitors 20a, 20b, 20c, and 20d.

FIG. 11 is a timing chart associated with a clock signal applied to the charge domain filter circuit 10 shown in FIG. 10. The first switch 14, the second switch 16, and the third switch 18 in the charge domain filter circuit 10 operate respectively in accordance with clock signals φ1, φ2, φ3, and φ4 which are different in phase as shown in FIG. 11.

The transconductor 12 outputs a current proportional to the voltage of a signal input to the transconductor 12.

The current output from the transconductor 12 is supplied to a capacitor selected by the first switch 14 whereby the capacitor is charged. More specifically, in the charge domain filter circuit 10 shown in FIG. 10, the first switch 14 sequentially switches its terminals in accordance with four clock signals φ1, φ2, φ3, and φ4 whereby the respective capacitors are sequentially charged.

The second switch 16 is for sequentially selecting capacitors to be sequentially reset to remove residual charges therefrom. More specifically, in the charge domain filter circuit 10 shown in FIG. 10, the second switch 16 sequentially selects its terminals in accordance with the four clock signals φ1, φ2, φ3, and φ4 whereby capacitors are sequentially selected and grounded thereby sequentially removing residual charges from the respective capacitors such that no charges originating from a previous signal remain therein.

The third switch 18 is for sequentially selecting capacitors from which to sequentially output charges stored therein to a circuit disposed at a following stage. More specifically, in the charge domain filter circuit 10 shown in FIG. 10, the third switch 18 sequentially selects its terminals in accordance with the four clock signals φ1, φ2, φ3, and φ4 whereby charges stored in the respective capacitors are sequentially output to the circuit disposed at the following stage.

In the first switch 14, the second switch 16, and the third switch 18, each terminal is labeled φ1, φ2, φ3, or φ4 to indicate a clock signal by which the terminal is selected. For example, a terminal label φ1 is selected when the clock signal φ1 is applied, a terminal label φ2 is selected when the clock signal φ2 is applied, and so on.

The current proportional to the voltage of the input signal is output from the transconductor 12 and is applied to one capacitor selected by the first switch 15 for a period of time t. In the charge domain filter circuit 10, after the selected capacitor has been charged for the period t, the resultant charge stored in the selected capacitor is output to the circuit at the following stage and sampled. For example, the first capacitor 20a is charged by the current output from the transconductor 12 via the first switch 14 controlled by the clock signal φ1, and the charge stored in this first capacitor 20a is output to the circuit at the following stage via the third switch 18 controlled by the clock signal φ2. The first capacitor 20a is then grounded via the second switch controlled by the clock signal φ4 such that the residual charge remaining in the first capacitor 20a is removed.

The capacitors 20a, 20b, 20c, and 20d are sequentially charged and discharged by the first switch 14, the second switch 16, and the third switch 18 whereby sampling is performed repeatedly with a sampling time of t. Because the input signal is sampled in a rectangular-shaped time window of t, the charge domain filter circuit 10a has a frequency characteristic such as that shown in FIG. 12. As shown in FIG. 12, the frequency characteristic of the charge domain filter circuit 10 is similar to a SINC function, and thus this circuit is called a SINC filter circuit.

SUMMARY OF THE INVENTION

As shown in FIG. 12, the SINC filter circuit allows a signal to be passed in a low frequency range. However, as shown in FIG. 12, the frequency characteristic of this SINC filter circuit has no flat part in the low frequency range. This means that when a signal having frequency components over a wide frequency range up to about 1/4t is input to the SINC filter circuit, attenuation occurs for high frequency components of the signal. That is, when a signal is passed through the SINC filter circuit, signal degradation occurs in high-frequency components of the signal, and thus the SINC filter circuit is unsuitable for use for filtering of a wideband signal.

In view of the above, the present invention provides a charge domain filter device capable of filtering a signal without producing significant degradation in high-frequency components of the signal.

More specifically, according to an embodiment of the present invention, there is provided a charge domain filter device including a SINC filter with a frequency characteristic expressed by a SINC function, and a bandpass filter connected to an output end of the SINC filter and having a frequency characteristic with a particular center frequency.

In this charge domain filter device, the SINC filter is configured to have the frequency characteristic expressed by a SINC function, and the bandpass is configured to have the frequency characteristic with the particular center frequency such that the charge domain filter device can pass a signal without producing significant degradation in a high-frequency component of the signal.

The bandpass filter may subtract a part of a previous sampled output signal from a current sampled output signal in synchronization with a clock of the SINC filter. That is, in this configuration, the bandpass filter subtracts a part of the previous sampled output signal from the current sampled output signal so that the bandpass filter functions as an IIR filter operable with low power consumption.

The SINC filter may include a first SINC filter adapted to provide the current sampled output signal, and a second SINC filter adapted to provide the previous sampled output signal, whereby the SINC filter is adapted to sample a differential signal. In this configuration, the first SINC filter is adapted to provide the current sampled output signal, and the second SINC filter is adapted to provide the previous sampled output signal, thereby making it possible for the SINC filter to sample a differential signal.

Then the sampling frequency of the SINC filter is set to 1/t, the center frequency of the bandpass filter may be given by $1/2^n t$ (where n is a positive integer) whereby the bandpass filter subtracts a part of the signal output from the SINC filter device so as to obtain a substantially flat frequency characteristic in a frequency range up to about $1/2^n t$.

The bandpass filter may subtract a part of a signal sampled and output in a clock cycle two clock cycles previous to a current clock cycle from the current sampled output signal so as to obtain a center frequency equal to 1/4t. In this configuration, the bandpass filter subtracts a part of the signal output from the SINC filter so as to obtain a center frequency equal to 1/4t.

The transfer function of the bandpass filter may be given by $$H(z) = \frac{1}{1 + \alpha z^{-2}}$$

The bandpass filter may subtract a part of a signal sampled and output in a clock cycle one clock cycle previous to a current clock cycle from the current sampled output signal so as to obtain a center frequency equal to 1/2t. In this configuration, the bandpass filter subtracts a part of the signal output from the SINC filter so as to obtain a center frequency equal to 1/2t. Note that this can be achieved simply by modifying a coefficient of a delay element.

The transfer function of the bandpass filter may be given by $$H(z) = \frac{1}{1 + \alpha z^{-1}}$$

As described above, the present invention provides an advantage that the charge domain filter device can filter a signal without producing significant degradation in a high-frequency component of the signal.

DESCRIPTION OF THE PREFERRED EMBODIMENTS

Figure 1:
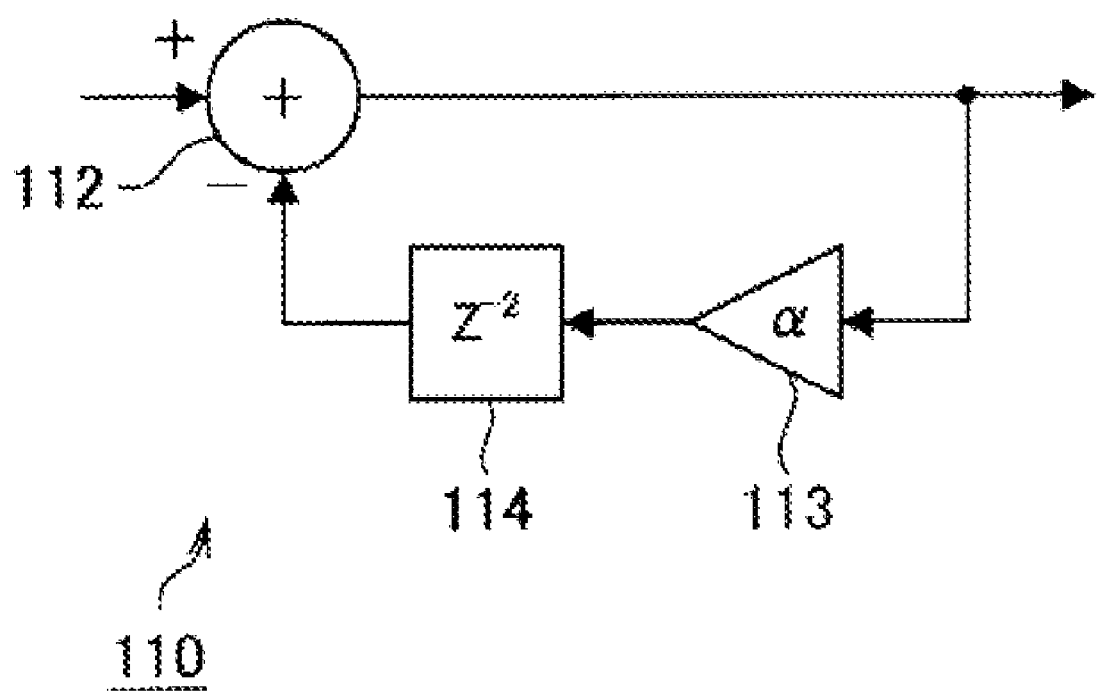
FIG. 1 is a schematic diagram showing a configuration of a BPF according to an embodiment of the present invention.

The present invention is described in further detail below with reference to specific embodiments in conjunction with the accompanying drawings. In the present description and drawings, similar parts are denoted by similar reference numerals, and a duplicated explanation thereof is omitted.

First Embodiment

According to a first embodiment of the present invention, a charge domain filter circuit operable without producing degradation in high-frequency components of a signal is realized by connecting a BPF (Band-Pass Filter) to an output end of a SINC filter circuit according a conventional technique whereby the frequency characteristic of the SINC filter circuit is compensated for by the BPF so as to achieve a flat frequency characteristic over a range up to 1/4t.

FIG. 1 is a diagram showing a configuration of a BPF according to the first embodiment of the present invention. As shown in FIG. 1, the BPF 110 according to the first embodiment of the present invention includes an adder 112, a multiplier 113, and a delay element 114.

The adder 112 subtracts a signal output from the delay element 114 from an input signal applied to the BPF 110, and the adder 112 outputs a resultant signal. The multiplier 113 multiplies the signal output from the adder 112 by a predetermined coefficient and outputs the result. The signal output from the multiplier 113 is input to the delay element 114. The delay element 114 delays the received signal by two clock (sampling clock) cycles and outputs the resultant delayed signal.

The transfer characteristic of the BPF 110 is given by a transfer function shown below.

$$H(z) = \frac{1}{1 + \alpha z^{-2}}$$

Figure 2:
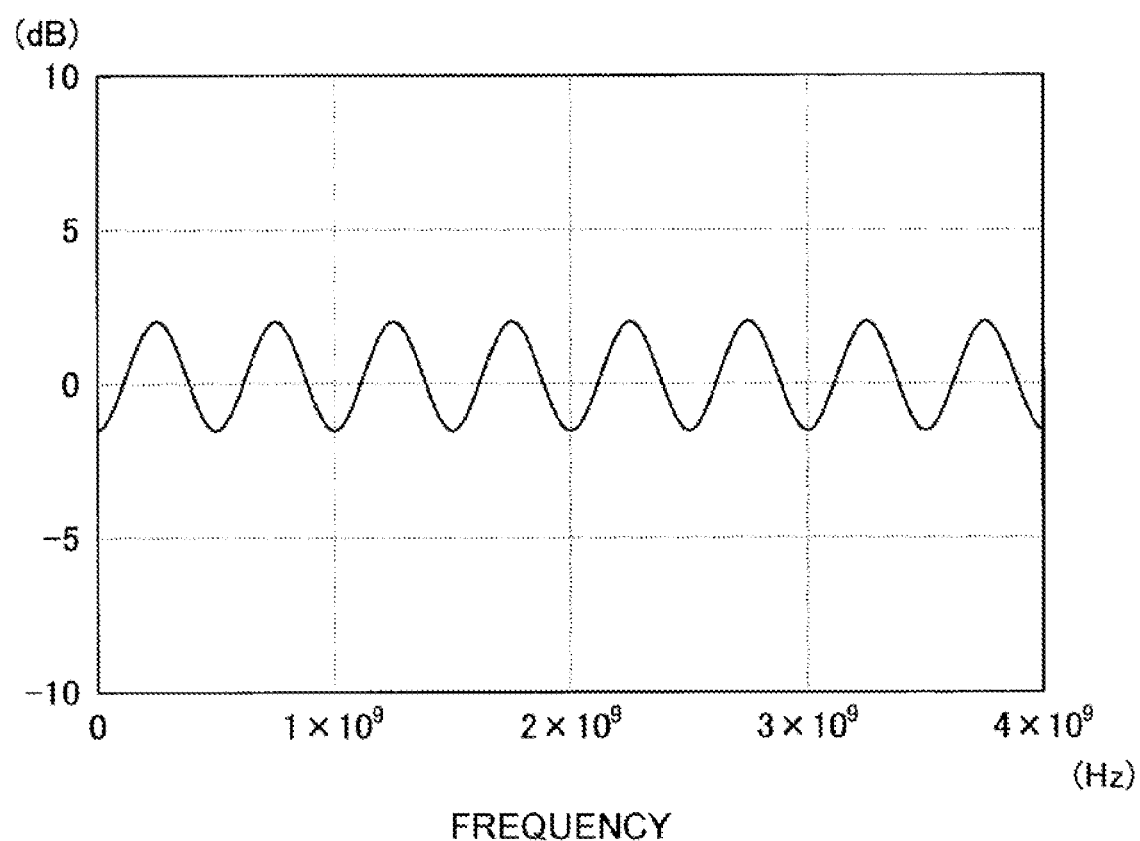
FIG. 2 is a diagram showing a frequency characteristic of a BPF according to an embodiment of the present invention.

In the BPF 110 shown in FIG. 1, if the sampling period t is set to 1 ns (i.e., t=1 ns) and the coefficient α of the multiplier 113 is set to 0.2 (i.e., α=0.2), then a frequency characteristic such as that shown in FIG. 2 is obtained. That is, in the BPF 110, a delay of two clock cycles by the delay element 114 causes the BPF 110 to have a frequency characteristic with a center frequency of 1/4t=250 MHz as shown in FIG. 2.

Figure 3:
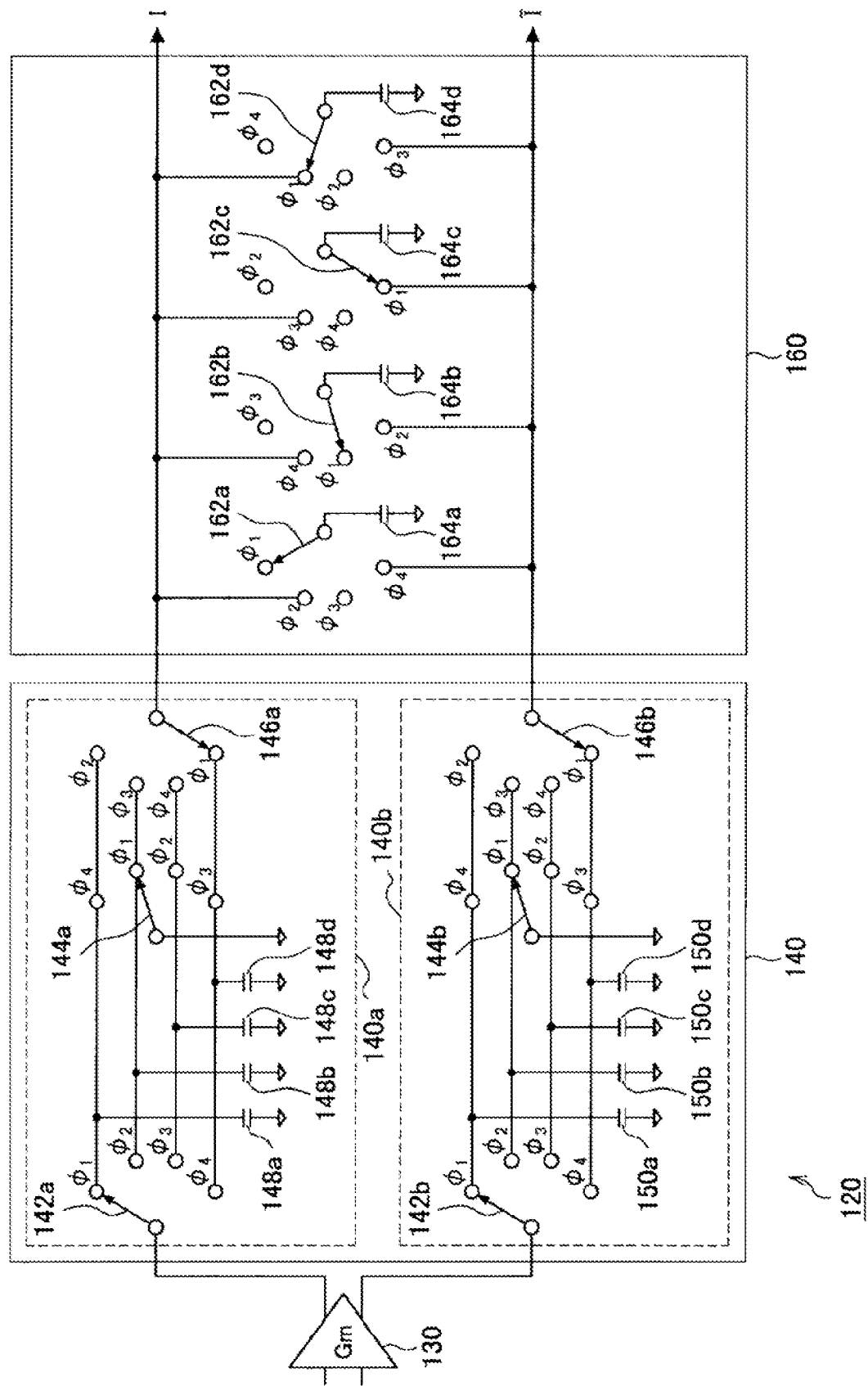
FIG. 3 is a schematic diagram showing a charge domain filter circuit according to an embodiment of the present invention.

If the BPF 110 having the frequency characteristic shown in FIG. 2 is connected to the output end of the SINC filter circuit, the frequency characteristic of the SINC filter circuit is compensated for by the BPF 110 so as to become flat, and thus the overall frequency characteristic allows an input signal to be passed over a passband without producing degradation in the signal. An example of a configuration of a charge domain filter circuit according to an embodiment of the present invention is described below with reference to FIG. 3. As shown in FIG. 3, the charge domain filter circuit 120 according to the present embodiment of the invention includes a transconductor 130, a SINC filter circuit 140, and a BPF 160.

The transconductor 130 includes two input nodes and two output nodes, and is adapted to output a current proportional to the voltage of an input signal.

The SINC filter circuit 140 includes a first SINC filter circuit 140a and a second SINC filter circuit 140b, one of which samples an original signal and the other of which samples an inverted signal which is opposite in phase to the original signal. The reason why the signal sampled herein is given in the form of the differential signal is because the inverted signal which is opposite in phase to the original signal is necessary when subtraction is performed in a later processing step. The SINC filter circuit 140 includes first switches 142a and 142b, second switches 144a and 144b, third switches 146a and 146b, and capacitors 148a, 148b, 148c, 148d, 150a, 150b, 150c, and 150d.

The first switches 142a and 142b are for selecting capacitors to be charged. More specifically, when the current output from the transconductor 130 is applied to the capacitors in the SINC filter circuit 140 to sequentially charge them on a phase-by-phase basis, capacitors to be charged are sequentially selected by the first switches 142a and 142b. In the charge domain filter circuit 120 according to the present embodiment shown in FIG. 3, the first switches 142a and 142b sequentially switch their connection terminals in accordance with four clock signals so that the current output from the transconductor 130 is supplied to capacitors connected to the connection terminals of the first switches 142a and 142b.

The second switches 144a and 144b are for selecting capacitors to be reset. More specifically, capacitors in the SINC filter circuit 140 are sequentially selected by the second switches 144a and 144b, and residual charges remaining in the selected capacitors are removed. In the charge domain filter circuit 120 according to the present embodiment shown in FIG. 3, the second switches 144a and 144b sequentially switch their connection terminals in accordance with the four clock signals to sequentially reset capacitors connected to the connection terminals such that no charge originating from a previous signal remains in the capacitors.

The third switches 146a and 146b are for selecting capacitors from which to output charges. More specifically, capacitors in the SINC filter circuit 140 are sequentially selected by the third switches 146a and 146b, and charges stored in the selected capacitors are output to a circuit disposed at a following stage. In the charge domain filter circuit 120 according to the present embodiment shown in FIG. 3, the third switches 146a and 146b switch their connection terminals in accordance with the four clock signals such that charges stored in the capacitors connected to the connection terminals are output to the circuit disposed at the following stage.

The capacitors 148a, 148b, 148c, 148d, 150a, 150b, 150c, and 150d are for storing charges. It is desirable that the capacitors 148a, 148b, 148c, 148d, 150a, 150b, 150c, and 150d be equal in capacitance.

The BPF 160 is configured using capacitors and switches so as to realize the functions of the BPF 110 shown in FIG. 1 which passes only a signal with a frequency in a specified frequency range but attenuates any signal with a frequency out of this frequency range. The BPF 160 includes a first switch 162a, a second switch 162b, a third switch 162c, a fourth switch 162d, and capacitors 164a, 164b, 164c, and 164d.

The first switch 162a, the second switch 162b, the third switch 162c, and the fourth switch 162d are for discharging or charging the capacitors 164a, 164b, 164c, and 164d. The first switch 162a, the second switch 162b, the third switch 162c, and the fourth switch 162d each include four terminals. Each of the first switch 162a, the second switch 162b, the third switch 162c, and the fourth switch 162d selects one of the four terminals in accordance with the four clock signals. Depending on which terminal is selected, the capacitors 164a, 164b, 164c, and 164d are discharged or charged.

The capacitors 164a, 164b, 164c, and 164d are for storing charges, and have substantially equal capacitance. As a result of switching operations of the first switch 162a, the second switch 162b, the third switch 162c, and the fourth switch 162d, the capacitors 164a, 164b, 164c, and 164d are discharged or charged by the current supplied from the SINC filter circuit 140.

The configuration of the charge domain filter circuit according to the present embodiment of the invention has been described above. Now, the operation of the charge domain filter circuit according to the present embodiment of the invention is described below.

Figure 11:
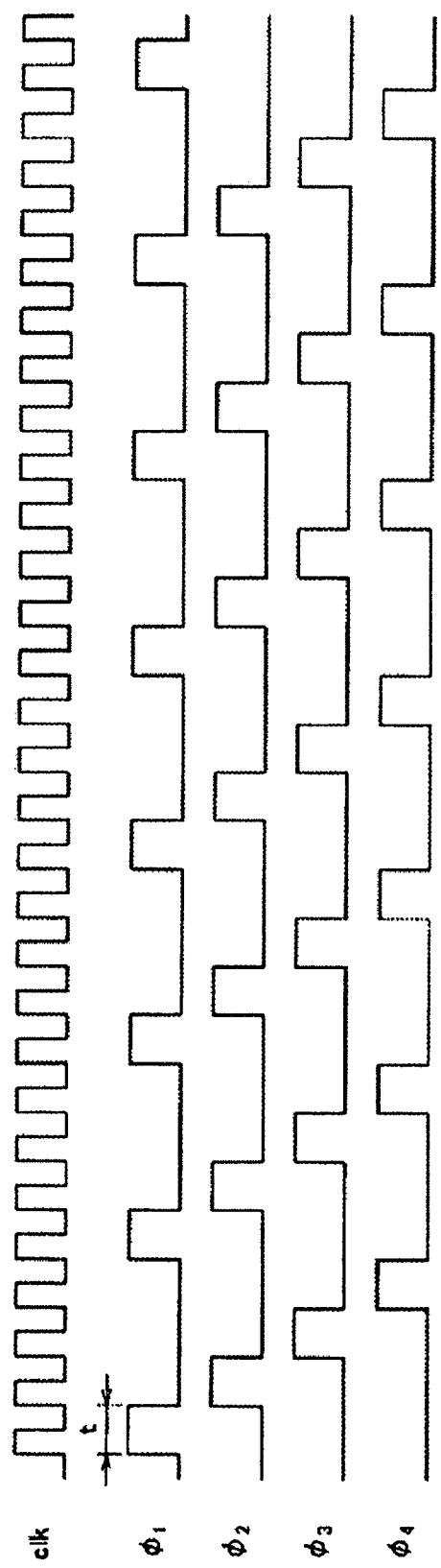
FIG. 11 is a timing chart associated with clock signals.
Figure 12:
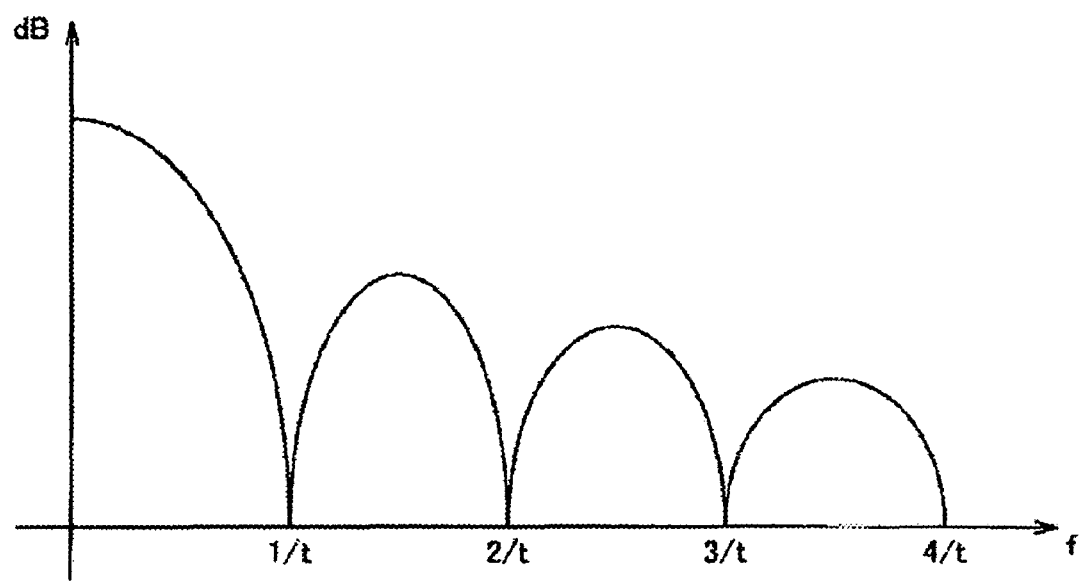
FIG. 12 is a diagram showing a frequency characteristic of a SINC filter circuit according to an embodiment of the present invention.

In the present embodiment of the invention, the respective switches in the charge domain filter circuit are controlled by clock signals such as those shown in FIG. 11. More specifically, as shown in FIG. 11, in the present embodiment of the invention, the operation of the charge domain filter circuit is controlled by four clock signals φ1, φ2, φ3, and φ4.

The first switches 142a and 142b, the second switches 144a and 144b, and the third switches 146a and 146b, and, in the BPF 160, the first switch 162a, the second switch 162b, the third switch 162c, and the fourth switch 162d respectively switch their terminal in accordance with the four clock signals. Note that, in the figures, each terminal of each switch is labeled φ1, φ2, φ3, or φ4 to indicate a clock signal by which the terminal is selected. For example, a terminal label φ1 is selected when the clock signal φ1 is applied, a terminal label φ2 is selected when the clock signal φ2 is applied, and so on. Hereinafter, a terminal which is selected when the clock signal φ1 is applied to a switch will be referred to a terminal corresponding to the clock signal φ1, a terminal which is selected when the clock signal φ2 is applied will be referred to a terminal corresponding to the clock signal φ2, and so on.

In a first phase, the clock signal φ1 is input to the charge domain filter circuit 120. In response, the first switches 142a and 142b are each connected to their terminal corresponding to the clock signal φ1, and the first switches 142a and 142b are maintained in this state for a period of time t so that the capacitors 148a and 150a are charged by the current output from the transconductor 130 for the period of time t.

In this first phase, when the clock signal φ1 is input to the charge domain filter circuit 120, the second switches 144a and 144b are each also connected to their terminal corresponding to the clock signal φ1, and the second switches 144a and 144b are maintained in this state for the period of time t so that the capacitors 148b and 150b are discharged to remove residual charge therefrom.

Furthermore, in this first phase, when the clock signal φ1 is input to the charge domain filter circuit 120, the third switches 146a and 146b are each also connected to their terminal corresponding to the clock signal φ1, and the third switches 146a and 146b are maintained in this state for the period of time t so that charges stored in the capacitors 148d and 150d are output to the circuit disposed at the following stage for the period of time t.

In the first phase, when the clock signal φ1 is input to the charge domain filter circuit 120, the first switch 162a, the second switch 162b, the third switch 162c, and the fourth switch 162d in the BPF 160 are each connected to their own terminal corresponding to the clock signal φ1 whereby the charges stored in the respective capacitors 164a and 164b are retained therein while the capacitor 164d is charged by the current supplied from the first SINC filter circuit 140a. In this phase, on the other hand, the capacitor 164c is connected to the output terminal of the second SINC filter circuit 140b which provides the inverted signal of the pair of the differential signals. As a result, the capacitor 164d is charged from the capacitor 148d by an amount determined by the ratio of the capacitance of the capacitor 184d to the capacitance of the capacitor 164d.

Because the capacitor 164c is connected to the output terminal of the second SINC filter circuit 140b which provides the inverted signal of the pair of the differential signals, the BPF 160 subtracts a part of the signal output from the SINC filter circuit 140.

Next, in a second phase after the first phase with the period t during which the clock signal φ1 is input, a clock signal φ2 is input to the charge domain filter circuit 120.

When the clock signal φ2 is input to the charge domain filter circuit 120, the first switches 142a and 142b are each connected to their terminal corresponding to the clock signal φ2, and the first switches 142a and 142b are maintained in this state for the period of time t so that the capacitors 148b and 150b are charged by the current output from the transconductor 130 for the period of time t.

In this second phase, when the clock signal φ2 is input to the charge domain filter circuit 120, the second switches 144a and 144b are each also connected to their terminal corresponding to the clock signal φ2, and the second switches 144a and 144b are maintained in this state for the period of time t so that the capacitors 148c and 150c are discharged to remove residual charge therefrom.

In this second phase, when the clock signal φ2 is input to the charge domain filter circuit 120, the third switches 146a and 146b are each also connected to their terminal corresponding to the clock signal φ2, and the third switches 146a and 146b are maintained in this state for the period of time t so that charges, which have been stored in the capacitors 148a and 150a in the first phase φ1, are output to the circuit disposed at the following stage for the period of time t.

In this second phase, when the clock signal φ2 is input to the charge domain filter circuit 120, the first switch 162a, the second switch 162b, the third switch 162c, and the fourth switch 162d in the BPF 160 are each connected to their own terminal corresponding to the clock signal φ2 whereby the charges stored in the respective capacitors 164c and 164d are retained therein, while the capacitor 164a is charged by the current supplied from the first SINC filter circuit 140a. In this phase, on the other hand, the capacitor 164b is connected to the output terminal of the second SINC filter circuit 140b which provides the inverted signal of the pair of the differential signals.

Next, in a third phase after the second phase with the period t during which the clock signal φ2 is input, the clock signal φ3 is input to the charge domain filter circuit 120.

When the clock signal φ3 is input to the charge domain filter circuit 120, the first switches 142a and 142b are each connected to their terminal corresponding to the clock signal φ3, and the first switches 142a and 142b are maintained in this state for the period of time t so that the capacitors 148c and 150c are charged by the current output from the transconductor 130 for the period of time t.

In this third phase, when the clock signal φ3 is input to the charge domain filter circuit 120, the second switches 144a and 144b are each also connected to their terminal corresponding to the clock signal φ3, and the second switches 144a and 144b are maintained in this state for the period of time t so that the capacitors 148d and 150d are discharged to remove residual charge therefrom.

In this third phase, when the clock signal φ3 is input to the charge domain filter circuit 120, the third switches 146a and 146b are each also connected to their terminal corresponding to the clock signal φ3, and the third switches 146a and 146b are maintained in this state for the period of time t so that charges, which have been stored in the capacitors 148b and 150b in the phase φ2, are output to the circuit disposed at the following stage for the period of time t.

In this third phase, when the clock signal φ3 is input to the charge domain filter circuit 120, the first switch 162a, the second switch 162b, the third switch 162c, and the fourth switch 162d in the BPF 160 ore each connected to their own terminal corresponding to the clock signal φ3 whereby the charges stored in the respective capacitors 164a and 164b are retained therein while the capacitor 164c is charged by the current supplied from the first SINC filter circuit 140a. In this phase, on the other hand, the capacitor 164d is connected to the output terminal of the second SINC filter circuit 140b which provides the inverted signal of the pair of the differential signals.

Next, in a fourth phase after the third phase with the period t during which the clock signal φ3 is input, the clock signal φ4 is input to the charge domain filter circuit 120.

When the clock signal φ4 is input to the charge domain filter circuit 120, the first switches 142a and 142b are each connected to their terminal corresponding to the clock signal φ4, and the first switches 142a and 142b are maintained in this state for the period of time t so that the capacitors 148d and 150d are charged by the current output from the transconductor 130 for the period of time t.

In this fourth phase, when the clock signal φ4 is input to the charge domain filter circuit 120, the second switches 144a and 144b are each also connected to their terminal corresponding to the clock signal φ4, and the second switches 144a and 144b are maintained in this state for the period of time t so that the capacitors 148a and 150a are discharged to remove residual charge therefrom.

In this fourth phase, when the clock signal φ4 is input to the charge domain filter circuit 120, the third switches 146a and 146b are each also connected to their terminal corresponding to the clock signal φ4, and the third switches 146a and 146b are maintained in this state for the period of time t so that charges, which have been stored in the capacitors 148c and 150c in the phase φ3, are output to the circuit disposed at the following stage for the period of time t.

In this fourth phase, when the clock signal φ4 is input to the charge domain filter circuit 120, the first switch 162a, the second switch 162b, the third switch 162c, and the fourth switch 162d in the BPF 160 are each connected to their own terminal corresponding to the clock signal φ2 whereby the charges stored in the respective capacitors 164c and 164d are retained therein, while the capacitor 162b is charged by the current supplied from the first SINC filter circuit 140a. In this phase, on the other hand, the capacitor 164a is connected to the output terminal of the second SINC filter circuit 140b which provides the inverted signal of the pair of the differential signals.

After completion of the fourth phase with the period t during which the clock signal φ4 is input, the clock signal φ1 is again input to the charge domain filter circuit 120. Thus, the process described above is performed repeatedly by sequentially applying the clock signals φ1 to φ4 to the charge domain filter circuit 120.

In the present configuration, as described above, the BPF 160 is connected to the output end of the SINC filter circuit 140 whereby a part of the signal output from the SINC filter circuit 140 is subtracted by the BPF 160. The amount of subtraction is determined by the ratio of the capacitance of the capacitors in the SINC filter circuit 140 to the capacitance of the capacitors in the BPF 160.

Figure 4:
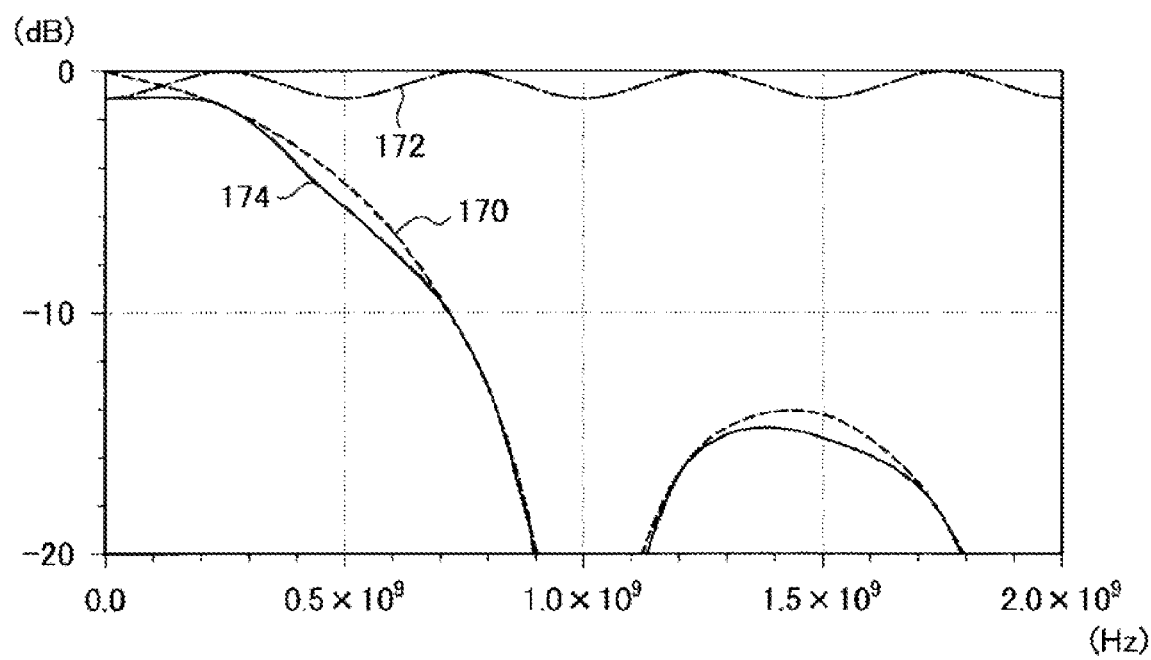
FIG. 4 is a diagram showing a frequency characteristic of a charge domain filter circuit according to an embodiment of the present invention.

Thus, the output of the SINC filter circuit 140 is compensates for by the BPF 160 so that the overall frequency characteristic of the charge domain filter circuit 120 becomes substantially flat. FIG. 4 shows a frequency characteristic of the charge domain filter circuit according to the present embodiment of the invention.

In FIG. 4, a curve 170 represents a frequency characteristic obtained when no compensation is made for the SINC filter circuit 140. A curve 172 represents a frequency characteristic of the BPF 160. A curve 174 represents a frequency characteristic of the charge domain filter circuit 120 compensated for by the BPF 160. When the sampling period t is set to 1 ns, the SINC filter circuit 140 has a steep notch at about 1 GHz, and the BPF 160 has a center frequency at about 250 MHz.

By compensating for the frequency characteristic of the SINC filter circuit 140 by using the BPF 160, the overall frequency characteristic becomes flat in a range up to about 200 MHz as represented by the curve 174.

In the present embodiment, the ratio of the capacitance of each capacitor in the SINC filter circuit 140 to the capacitance of each capacitor in the BPF 160 is set to 1:0.045 to achieve the flat frequency characteristic as shown in FIG. 4.

As described above, the charge domain filter circuit according to the present embodiment of the invention has a flat frequency characteristic over a wide passband, which allows a signal in the wide passband to be passed without producing degradation in a high-frequency component of the signal.

Second Embodiment

In the first embodiment described above, the charge domain filter circuit capable of passing an input signal in the passband without producing degradation in high-frequency components is realized by making compensation in frequency characteristic in the passband so as to obtain the flat frequency characteristic up to the frequency of 1/4t. In a second embodiment described below, compensation for frequency characteristic is made up to a frequency of 1/2t to realize a charge domain filter circuit having a flat frequency characteristic over a passband up to the frequency of 1/2t without producing degradation in high-frequency components.

Figure 5:
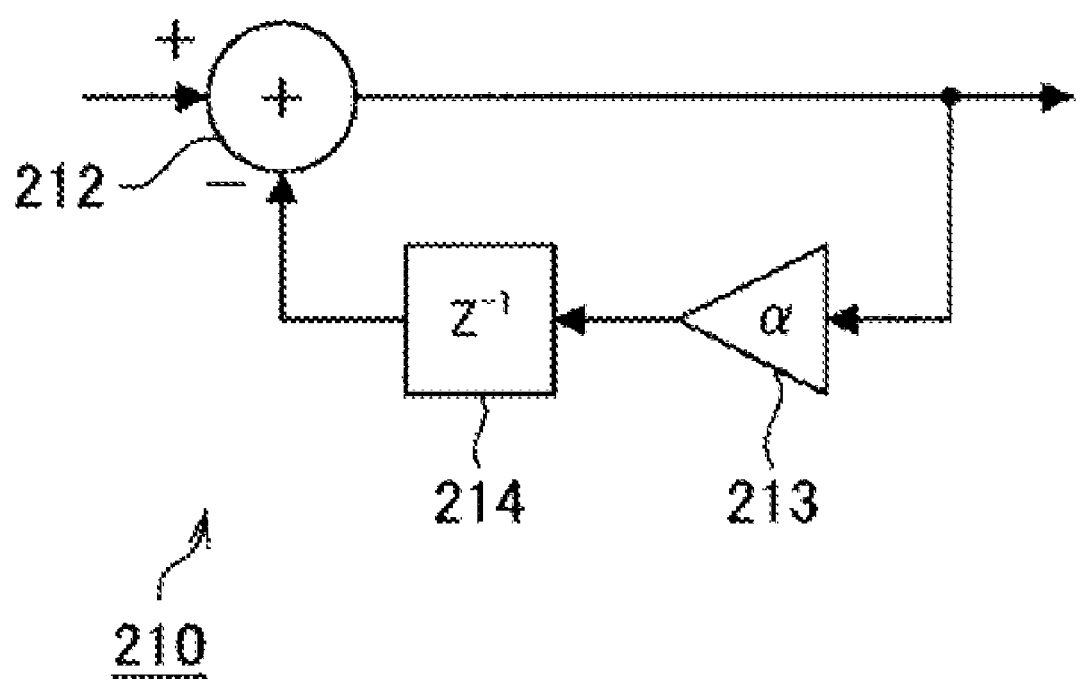
FIG. 5 is a schematic diagram showing a configuration of a BPF according to an embodiment of the present invention.

FIG. 5 is a diagram showing a configuration of a BPF according to the second embodiment of the present invention. As shown in FIG. 5, the BPF 210 according to the second embodiment of the present invention includes an adder 212, a multiplier 213, and a delay element 214.

As with the adder 112 according to the first embodiment described above, the adder 212 according to the present embodiment subtracts a signal output from the delay element 214 from an input signal applied to the BPF 210, and the adder 212 outputs a resultant signal. The multiplier 213 multiplies the signal output from the adder 212 by a predetermined coefficient and outputs the result. The output from the multiplier 213 is input to the delay element 214. The delay element 214 delays the received signal by one clock cycle and outputs the resultant delayed signal.

Figure 6:
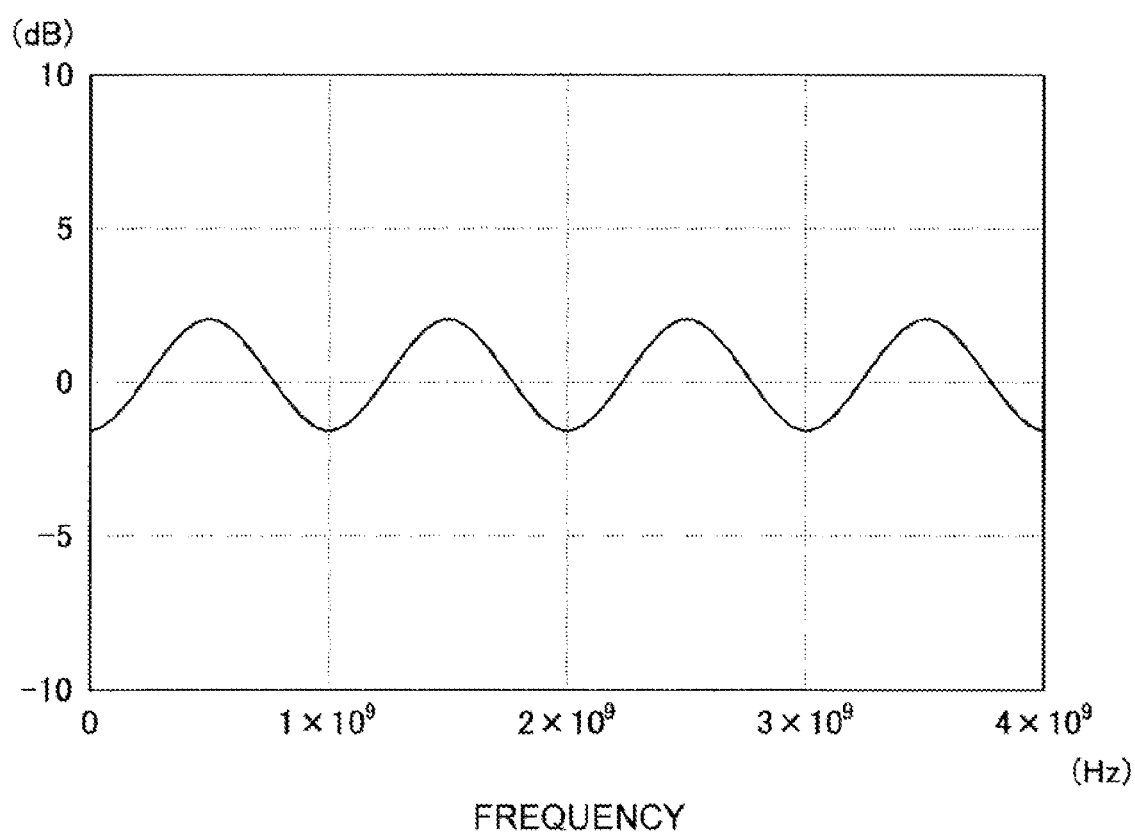
FIG. 6 is a diagram showing a frequency characteristic of a BPF according to an embodiment of the present invention.

In the BPF 210 shown in FIG. 5, if the sampling period t is set to 1 ns (i.e., t=1 ns) and the coefficient α of the multiplier 213 is set to 0.2 (i.e., α=0.2), then a frequency characteristic such as that shown in FIG. 6 is obtained. That is, in the BPF 210, a delay of one clock cycle by the delay element 214 causes the BPF 210 to have a frequency characteristic with a center frequency of 1/2t=500 MHz as shown in FIG. 6.

Figure 7:
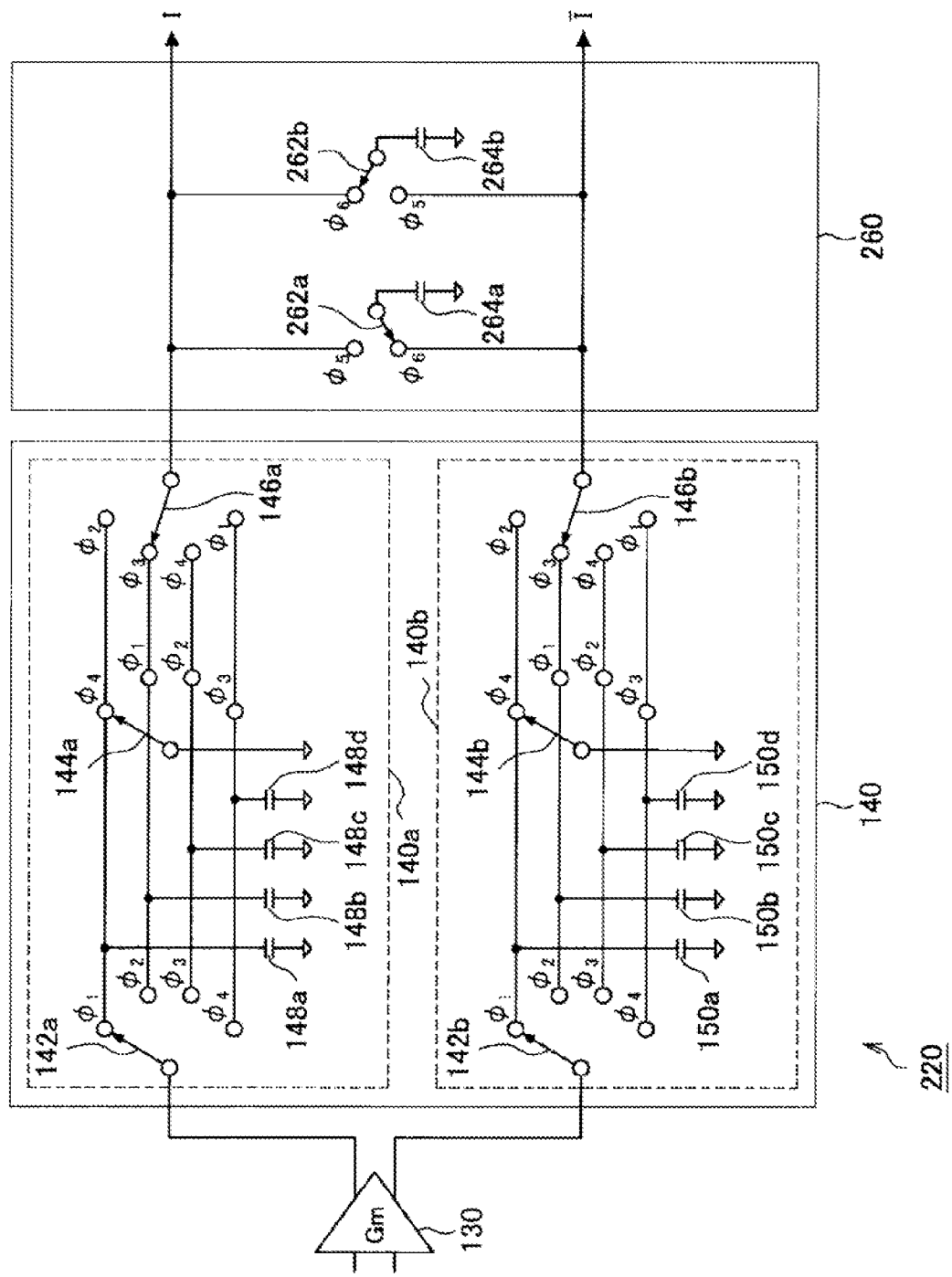
FIG. 7 is a schematic diagram showing a charge domain filter circuit according to an embodiment of the present invention.

If the BPF 210 having the frequency characteristic given by a SINC function such as that shown in FIG. 5 is connected to the output end of the SINC filter circuit, the frequency characteristic of the SINC filter circuit can be compensated for by the BPF 210. An example of a configuration of a charge domain filter circuit according to the second embodiment of the present invention is described below with reference to FIG. 7. As shown in FIG. 7, the charge domain filter circuit 220 according to the present embodiment of the invention includes a transconductor 130, a SINC filter circuit 140, and a BPF 260.

The transconductor 130 and the SINC filter circuit 140 are substantially equal in configuration to the transconductor 130 and the SINC filter circuit 140 according to the first embodiment described above, and thus a duplication explanation thereof is omitted herein.

The BPF 260 is configured to pass only a signal with a frequency in a specified frequency range but attenuate any signal with a frequency out of this frequency range. In the present embodiment, unlike the BPF 160 according to the first embodiment described above, the BPF 260 includes a first switch 262a, a second switch 262b, and capacitors 264a and 264b.

The first switch 262a and the second switch 262b operate so as to charge or discharge the capacitors 264a and 264b. The first switch 262a and the second switch 262b each have two terminals which are selected in accordance with control signals applied to the first switch 262a and the second switch 262b. Depending on which terminal is selected, the capacitors 264a and the 264b are charged or discharged.

The capacitors 264a and 264b are for storing charges. They are sequentially discharged or charged by the current supplied from the SINC filter circuit 140 via the first switch 262a or the second switch 262b.

The configuration of the charge domain filter circuit according to the present embodiment of the invention has been described above. Now, the operation of the charge domain filter circuit according to the present embodiment of the invention is described below.

Figure 8:
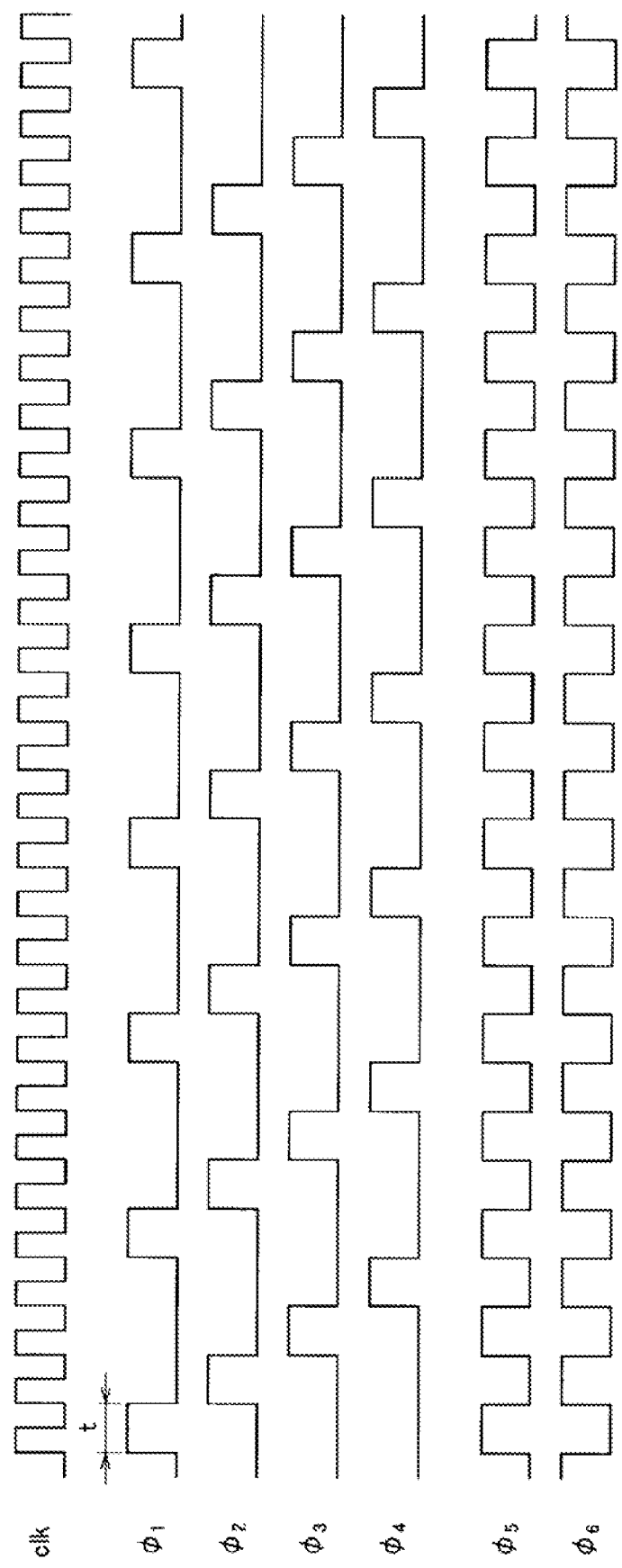
FIG. 8 is a diagram showing clock signals which control the operation of a charge domain filter circuit according to an embodiment of the present invention.

FIG. 8 is a diagram showing clock signals which control the operation of the charge domain filter circuit according to the present embodiment of the invention. In the present embodiment of the invention, as shown in FIG. 8, the operation of the charge domain filter circuit is controlled by six clock signals φ1, φ2, φ3, φ4, φ5, and φ6.

In the present embodiment, as in the first embodiment, the clock signals φ1, φ2, φ3, and φ4 control the operation of the first switches 142a and 142b, the second switches 144a and 144b, and the third switches 146a and 146b in the SINC filter circuit 140. In addition to these clock signals, the clock signals φ5 and φ6 are used to control the operation of the first switch 262a and the second switch 262b in the BPF 260.

More specifically, the first switches 142a and 142b, the second switches 144a and 144b, and the third switches 146a and 146b each have terminals corresponding to the clock signals φ1, φ2, φ3, and φ4, respectively, and the first switch 262a and the second switch 262b each have terminals corresponding to the clock signals φ5 and φ6, respectively. Note that a terminal corresponding to the clock signal φ1 is selected when the clock signal φ1 is applied to a switch, a terminal corresponding to the clock signal φ2 is selected when the clock signal φ2 is applied to the switch, and so on.

First, in a first phase, the clock signal φ1 is input to the charge domain filter circuit 220, the first switches 142a and 142b are each connected to their terminal corresponding to the clock signal φ1, and the first switches 142a and 142b are maintained in this state for a period of time t so that the capacitors 148a and 150a are charged by the current output from the transconductor 130 for the period of time t.

In this first phase, when the clock signal φ1 is input to the charge domain filter circuit 220, the second switches 144a and 144b are each also connected to their terminal corresponding to the clock signal φ1, and the second switches 144a and 144b are maintained in this state for the period of time t so that the capacitors 148b and 150b are discharged to remove residual charge therefrom.

In this first phase, when the clock signal φ1 is input to the charge domain filter circuit 220, the third switches 146a and 146b are each also connected to their terminal corresponding to the clock signal φ1, and the third switches 146a and 146b are maintained in this state for the period of time t so that charges stored in the capacitors 148d and 150d are output to the circuit disposed at the following stage for the period of time t.

In this first phase, when the clock signal φ5 is input to the charge domain filter circuit 220, the first switch 262a and the second switch 262b in the BPF 260 are each connected to their own terminal corresponding to the clock signal φ5 whereby the capacitor 264a is charged by the current supplied from the first SINC filter circuit 140a, and the capacitor 264b is connected to the output terminal of the second SINC filter circuit 140b which provides the inverted signal of the pair of the differential signals.

By connecting the capacitor 264a to the output terminal of the second SINC filter circuit 140b which provides the inverted signal of the pair of the differential signals in the above-described manner, the BPF 260 subtracts a part of the signal output from the SINC filter circuit 140.

Next, in a second phase after the first phase with the period t during which the clock signal φ1 and the clock signal φ5 are input, the clock signal φ2 and a clock signal φ6 are input to the charge domain filter circuit 220.

In this second phase, when the clock signal φ2 is input to the charge domain filter circuit 220, the first switches 142a and 142b are each connected to their terminal corresponding to the clock signal φ2, and the first switches 142a and 142b are maintained in this state for the period of time t so that the capacitors 148b and 150b are charged by the current output from the transconductor 130 for the period of time t.

In this second phase, when the clock signal φ2 is input to the charge domain filter circuit 220, the second switches 144a and 144b are each also connected to their terminal corresponding to the clock signal φ2, and the second switches 144a and 144b are maintained in this state for the period of time t so that the capacitors 148c and 150c are discharged to remove residual charge therefrom.

In this second phase, when the clock signal φ2 is input to the charge domain filter circuit 220, the third switches 146a and 146b are each also connected to their terminal corresponding to the clock signal φ2, and the third switches 146a and 146b are maintained in this state for the period of time t so that charges, which have been stored in the capacitors 148a and 150a in the phase φ1, are output to the circuit disposed at the following stage for the period of time t.

In this second phase, when the clock signal φ6 is input to the charge domain filter circuit 220, the first switch 262a and the second switch 262b in the BPF 260 are each connected to their own terminal corresponding to the clock signal φ6 whereby the capacitor 262b is charged by the current supplied from the first SINC filter circuit 140a, and the capacitor 264a is connected to the output terminal of the second SINC filter circuit 140b which provides the inverted signal of the pair of the differential signals.

In a third phase after the second phase with the period t during which the clock signal φ2 and the clock signal φ6 are input, the clock signal φ3 and the clock signal φ5 are input to the charge domain filter circuit 220.

In this third phase, when the clock signal φ3 is input to the charge domain filter circuit 220, the first switches 142a and 142b are each connected to their terminal corresponding to the clock signal φ3, and the first switches 142a and 142b are maintained in this state for the period of time t so that the capacitors 148c and 150c are charged by the current output from the transconductor 130 for the period of time t.

In this third phase, when the clock signal φ3 is input to the charge domain filter circuit 220, the second switches 144a and 144b are each also connected to their terminal corresponding to the clock signal φ3, and the second switches 144a and 144b are maintained in this state for the period of time t so that the capacitors 148d and 150d are discharged to remove residual charge therefrom.

In this third phase, when the clock signal φ3 is input to the charge domain filter circuit 220, the third switches 146a and 146b are each also connected to their terminal corresponding to the clock signal φ3, and the third switches 146a and 146b are maintained in this state for the period of time t so that charges, which have been stored in the capacitors 148b and 150b in the phase φ2, are output to the circuit disposed at the following stage for the period of time t.

In this third phase, when the clock signal φ5 is input to the charge domain filter circuit 220, the first switch 262a and the second switch 262b in the BPF 260 are each connected to their own terminal corresponding to the clock signal φ5 whereby the capacitor 264a is charged by the current supplied from the first SINC filter circuit 140a, and the capacitor 264b is connected to the output terminal of the second SINC filter circuit 140b which provides the inverted signal of the pair of the differential signals.

In a fourth phase after the second phase with the period t during which the clock signal φ3 and the clock signal φ5 are input, the clock signal φ4 and the clock signal φ6 are input to the charge domain filter circuit 220.

In this third phase, when the clock signal φ4 is input to the charge domain filter circuit 220, the first switches 142a and 142b are each connected to their terminal corresponding to the clock signal φ4, and the first switches 142a and 142b are maintained in this state for the period of time t so that the capacitors 148d and 150d are charged by the current output from the transconductor 130 for the period of time t.

In this fourth phase, when the clock signal φ4 is input to the charge domain filter circuit 220, the second switches 144a and 144b are each also connected to their terminal corresponding to the clock signal φ4, and the second switches 144a and 144b are maintained in this state for the period of time t so that the capacitors 148a and 150a are discharged to remove residual charge therefrom.

In this fourth phase, when the clock signal φ4 is input to the charge domain filter circuit 220, the third switches 146a and 146b are each also connected to their terminal corresponding to the clock signal φ4, and the third switches 146a and 146b are maintained in this state for the period of time t so that charges, which have been stored in the capacitors 148c and 150c in the phase φ3, are output to the circuit disposed at the following stage for the period of time t.

In this fourth phase, when the clock signal φ6 is input to the charge domain filter circuit 220, the first switch 262a and the second switch 262b in the BPF 260 are connected to respective terminals corresponding to the clock signal φ6 whereby the capacitor 262b is charged by the current supplied from the first SINC filter circuit 140a, and the capacitor 264a is connected to the output terminal of the second SINC filter circuit 140b which provides the inverted signal of the pair of the differential signals.

After completion of the fourth phase with the period t during which the clock signal φ4 and the clock signal φ6 are input, the clock signal φ1 and the clock signal φ5 are again input to the charge domain filter circuit 220. Thus, the process described above is performed repeatedly by sequentially applying the clock signals φ1 to φ4 and the clock signals φ5 and φ6 to the charge domain filter circuit 220.

Also in the present embodiment of the invention, as described above, the BPF 260 is connected to the output end of the SINC filter circuit 140 such that the BPF 260 subtracts a part of the signal output from the SINC filter circuit 140. The amount of subtraction is determined by the ratio of the capacitance of the capacitors in the SINC filter circuit 140 to the capacitance of the capacitors in the BPF 260.

Figure 9:
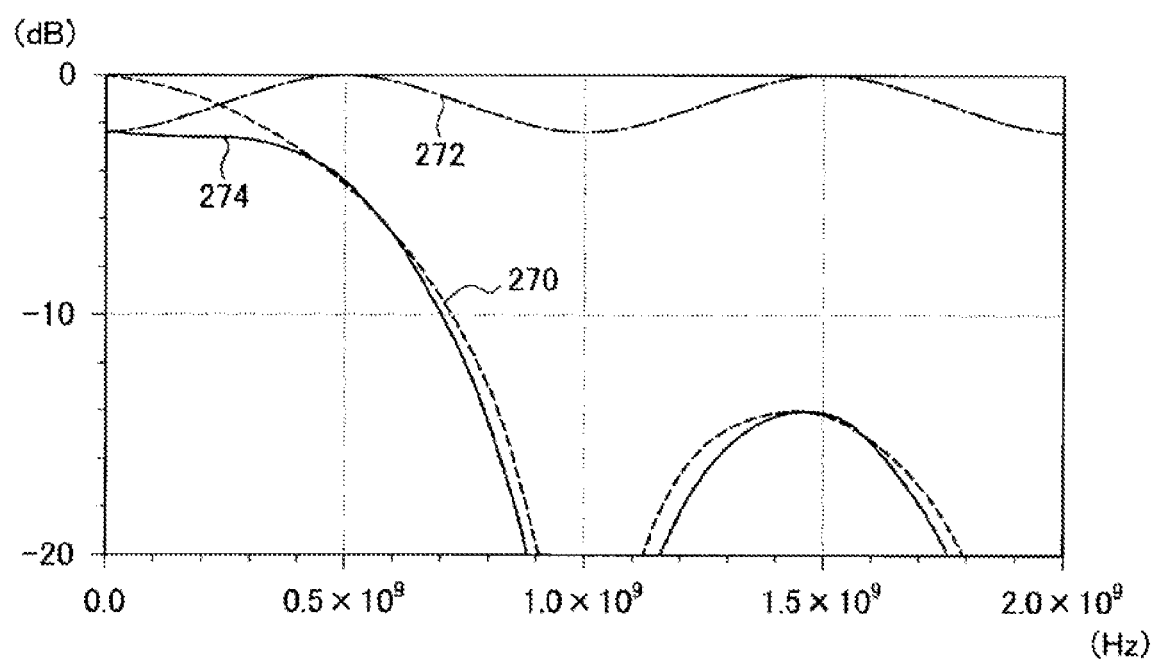
FIG. 9 is a diagram showing a frequency characteristic of a charge domain filter circuit according to an embodiment of the present invention.
Figure 10:
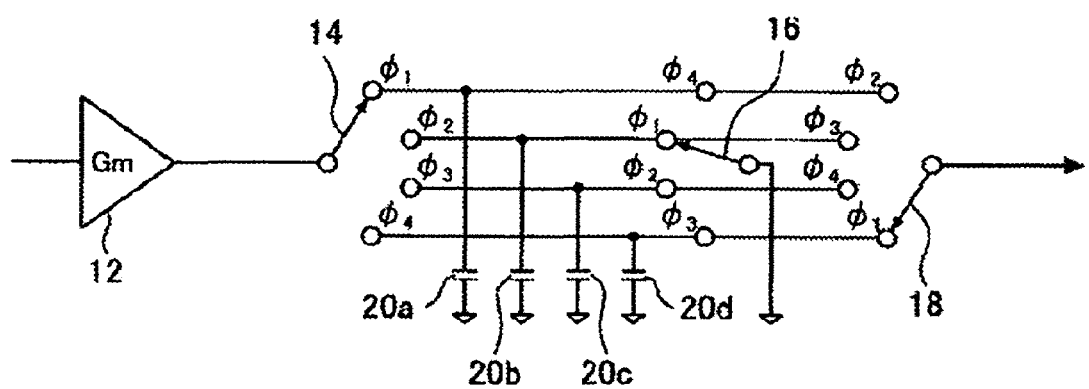
FIG. 10 shows a configuration of a charge domain filter circuit functioning as a SINC filter circuit according to a conventional technique.

Thus, the output of the SINC filter circuit 140 is compensated for by the BPF 260 so that the charge domain filter circuit 220 has a substantially flat frequency characteristic. FIG. 9 shows the frequency characteristic of the charge domain filter circuit according to the present embodiment of the invention.

In FIG. 9, a curve 270 represents a frequency characteristic obtained when no compensation is made for the SINC filter circuit 140. A curve 272 represents a frequency characteristic of the BPF 260. A curve 274 represents the frequency characteristic of the charge domain filter circuit 220 obtained by compensating for the frequency characteristic of the SINC filter circuit 140 by the BPF 260. When the sampling period t is set to 1 ns, the SINC filter circuit 140 has a steep notch at about 1 GHz, and the BPF 260 has a center frequency at about 500 MHz.

As can be seen from FIG. 9, the output of the SINC filter circuit 140 is compensates for by the BPF 260 such that the overall frequency characteristic becomes flat in a range up to about 400 MHz as represented by the curve 274.

In the present embodiment, the ratio of the capacitance of each capacitor in the SINC filter circuit 140 to the capacitance of each capacitor in the BPF 260 is set to 1:0.1 to achieve the flat frequency characteristic as represented by the curve 274 in FIG. 9.

As described above, as with the charge domain filter circuit according to the first embodiment described above, the charge domain filter circuit according to the second embodiment of the invention has a flat frequency characteristic over a wide passband, which allows a signal in the passband to be passed without producing degradation in high-frequency components of the signal.

Although the present invention has been described above with reference to specific embodiments, the invention is not limited to these embodiments. It should be understood by those skilled in the art that various modifications, combinations, sub-combinations and alterations may occur depending on design requirements and other factors insofar as they are within the scope of the appended claims or the equivalents thereof.

For example, in the embodiments described above, in order to compensate for the frequency characteristic of a SINC filter circuit, a bandpass filter whose center frequency is set at 1/4t or 1/2t is connected to the output end of the SINC filter circuit. However, the bandpass filter connected to the output end of the SINC filter circuit is not limited to those employed in the embodiments described above. For example, a bandpass filter whose center frequency is set at 1/8t may be connected to the output end of a SINC filter circuit to compensate for the frequency characteristic of the SINC filter circuit.

In the embodiments described above, the SINC filter circuit is configured using four capacitors and three switches. However, the configuration of the SINC filter circuit is not limited to such a configuration. In the first embodiment described above, the bandpass filter is configured using four capacitors and four switches, while two capacitors and two switches are used to realize the bandpass filter in the second embodiments. However, the configuration of the bandpass filter is not limited to those. Furthermore, the number of terminals of each switch is not limited to four.

Thus, it should be again understood by those skilled in the art that various modifications, combinations, sub-combinations and alterations may occur depending on design requirements and other factors insofar as they are within the scope of the appended claims or the equivalents thereof.

What is claimed is:

1. A charge domain filter device comprising:
   a SINC filter including capacitors having a first capacitance and switches, the switches being used to control the capacitors and to implement a SINC function based on a frequency characteristic of the SINC filter, wherein the SINC filter generates a filtered signal based on the SINC function; and
   a bandpass filter connected to an output end of the SINC filter and including a capacitor having a second capacitance, the bandpass filter having a frequency characteristic with a center frequency and processing the filtered signal based on the center frequency and a ratio between the first capacitance and the second capacitance.

2. The charge domain filter device according to claim 1, wherein the bandpass filter subtracts a part of an output signal generated by the SINC filter from the filtered signal in synchronization with a clock signal provided to the SINC filter, the output signal being generated before the filtered signal.

3. The charge domain filter device according to claim 2, wherein the SINC filter includes:

a first SINC filter adapted to provide the filtered signal; and a second SINC filter adapted to provide the output signal, wherein the SINC filter is adapted to sample a differential signal.

4. The charge domain filter device according to claim 2, wherein when a sampling frequency based on the frequency characteristic of the SINC filter is set to 1/t, the center frequency of the bandpass filter is set to $1/2^n t$, where t represents a time duration and n is a positive integer.

5. The charge domain filter device according to claim 4, wherein the part of the output signal is generated such that the filtered signal is generated after two clock cycles of the clocking signal have passed subsequent to the generation of the part of the output signal, the bandpass filter operating at a center frequency equal to 1/4t during generation of the part of the output signal.

6. The charge domain filter device according to claim 5, wherein the transfer function of the band pass filter is given by $$H(z) = \frac{1}{1 + \alpha z^{-2}}$$

where α is a coefficient of the band pass filter and z is based on a delay between generation of the part of the output signal and the generation of the filtered signal.

7. The charge domain filter device according to claim 4, wherein the part of the output signal is generated such that the filtered signal is generated after two clock cycles of the clocking signal have passed subsequent to the generation of the part of the output signal, the bandpass filter operating at a center frequency equal to 1/2t during generation of the part of the output signal.

8. The charge domain filter device according to claim 7, wherein the transfer function of the bandpass filter is given by $$H(z) = \frac{1}{1 + \alpha z^{-1}}$$

where α is a coefficient of the band pass filter and z is based on a delay between generation of the part of the output signal and the generation of the filtered signal.

\* \* \* \* \*